United States Patent
Lam

(10) Patent No.: US 11,777,499 B2
(45) Date of Patent: Oct. 3, 2023

(54) RADIO FREQUENCY SWITCH BIASING TOPOLOGIES

(71) Applicant: SKYWORKS SOLUTIONS, INC., Irvine, CA (US)

(72) Inventor: Lui Ray Lam, Lexington, MA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 17/709,744

(22) Filed: Mar. 31, 2022

(65) Prior Publication Data
US 2022/0321119 A1    Oct. 6, 2022

Related U.S. Application Data

(60) Provisional application No. 63/169,053, filed on Mar. 31, 2021.

(51) Int. Cl.
| | |
|---|---|
| H03K 17/693 | (2006.01) |
| H03K 17/687 | (2006.01) |
| H01L 23/66 | (2006.01) |
| H04B 1/16 | (2006.01) |

(52) U.S. Cl.
CPC ....... H03K 17/693 (2013.01); H03K 17/6871 (2013.01); H01L 23/66 (2013.01); H01L 2223/6672 (2013.01); H01L 2223/6677 (2013.01); H04B 1/1615 (2013.01)

(58) Field of Classification Search
CPC ............. H03K 17/693; H03K 17/6871; H03K 17/102; H01L 23/66; H01L 2223/6672; H01L 2223/6677; H04B 1/1615
See application file for complete search history.

(56) References Cited

U.S. PATENT DOCUMENTS

| | | | | |
|---|---|---|---|---|
| 8,868,008 | B2* | 10/2014 | Tanaka | H03K 17/102 455/83 |
| 2008/0116751 | A1* | 5/2008 | Kihara | H03K 17/6874 307/113 |
| 2014/0009189 | A1* | 1/2014 | Mauder | H01L 29/42316 327/109 |
| 2018/0131369 | A1* | 5/2018 | Popplewell | H03K 17/693 |

* cited by examiner

*Primary Examiner* — Metasebia T Retebo
(74) *Attorney, Agent, or Firm* — Chang & Hale LLP

(57) ABSTRACT

A switching circuit comprises a first series switch coupled to a first output port, the first series switch including a first field-effect transistor (FET), a second FET, a third FET, a fourth FET, a fifth FET, and a sixth FET, a second series switch coupled to a second output port, and coupling circuitry configured to couple a gate of the fifth FET and a gate of the sixth FET to a first node, a source of the fifth FET and a drain of the sixth FET to a second node, a source of the first FET and a drain of the second FET to a third node, a gate of the first FET and a drain of the fifth FET to a fourth node, a gate of the second FET and a source of the sixth FET to a fifth node, the fourth node and the fifth node to a first gate voltage, and the first node to a second gate voltage that is different than the first gate voltage.

20 Claims, 5 Drawing Sheets

RADIO FREQUENCY SWITCH BIASING TOPOLOGIES

CROSS-REFERENCE TO RELATED APPLICATION

This application claims priority to U.S. Provisional Application No. 63/169,053 filed Mar. 31, 2021, entitled RADIO FREQUENCY SWITCH BIASING TOPOLOGIES, the disclosure of which is hereby expressly incorporated by reference herein in its respective entirety.

BACKGROUND

Field

The present disclosure relates to switching circuits, related devices, and related methods for radio-frequency (RF) applications.

Description of the Related Art

Switches, including RF and/or Single Pole Double Throw (SPDT) switches, can be important components of RF and/or other circuit applications. When a switch is turned on (i.e., in an ON state), the switch requires a positive gate-to-source voltage ($V_{GS}$) to minimize on-resistance ($R_{ON}$) of the switch. When a switch is turned off (i.e., in an OFF state), the switch requires a negative $V_{GS}$ to minimize off-capacitance ($C_{OFF}$) and/or non-linearity.

SUMMARY

In accordance with some implementations, the present disclosure relates to a switching circuit comprising a first series switch coupled to a first output port. The first series switch includes a first field-effect transistor (FET), a second FET, a third FET, a fourth FET, a fifth FET, and a sixth FET. The switching circuit further comprises a second series switch coupled to a second output port and coupling circuitry configured to couple a gate of the fifth FET and a gate of the sixth FET to a first node, a source of the fifth FET and a drain of the sixth FET to a second node, a source of the first FET and a drain of the second FET to a third node, a gate of the first FET and a drain of the fifth FET to a fourth node, a gate of the second FET and a source of the sixth FET to a fifth node, the fourth node and the fifth node to a first gate voltage, and the first node to a second gate voltage that is different than the first gate voltage.

In some embodiments, the switching circuit further comprises a first shunt switch. The coupling circuitry may be further configured to couple the first output port between the first series switch and the first shunt switch.

The switching circuit may further comprise a second shunt switch. In some embodiments, the coupling circuitry is further configured to couple the second output port between the second series switch and the second shunt switch.

In some embodiments, the first shunt switch comprises four series-connected FETs. The second shunt switch may comprise four series-connected FETs.

The second series switch may comprise four series-connected FETs. In some embodiments, the first series switch further comprises a seventh FET and an eighth FET.

In some embodiments, the first gate voltage is configured to be approximately 0 V while the second gate voltage is positive. The second gate voltage may be configured to be approximately 0 V while the first gate voltage is positive.

Some implementations of the present disclosure relate to a wireless device comprising a first series switch coupled to a first output port. The first series switch includes a first field-effect transistor (FET), a second FET, a third FET, a fourth FET, a fifth FET, and a sixth FET. The wireless device further comprises a second series switch coupled to a second output port and coupling circuitry configured to couple the fifth FET to the first FET, the fifth FET to the sixth FET, the first FET to the second FET, the first FET and the second FET to a first gate voltage, and the fifth FET and the sixth FET to a second gate voltage that is different than the first gate voltage.

The wireless device may further comprise a first shunt switch. The coupling circuitry may be further configured to couple the first output port between the first series switch and the first shunt switch.

In some embodiments, the wireless device further comprises a second shunt switch. The coupling circuitry may be further configured to couple the second output port between the second series switch and the second shunt switch.

The first shunt switch may comprise four series-connected FETs. The second shunt switch may comprise four series-connected FETs. In some embodiments, the second series switch comprises four series-connected FETs.

In accordance with some implementations of the present disclosure, a semiconductor die comprises a first series switch coupled to a first output port. The first series switch includes a first field-effect transistor (FET), a second FET, a third FET, a fourth FET, a fifth FET, and a sixth FET. The semiconductor die further comprises a second series switch coupled to a second output port and coupling circuitry configured to couple the fifth FET to the first FET, the fifth FET to the sixth FET, the first FET to the second FET, the first FET and the second FET to a first gate voltage, and the fifth FET and the sixth FET to a second gate voltage that is different than the first gate voltage.

In some embodiments, the semiconductor die further comprises a first shunt switch. The coupling circuitry may be further configured to couple the first output port between the first series switch and the first shunt switch.

The semiconductor die may further comprise a second shunt switch. The coupling circuitry may be further configured to couple the second output port between the second series switch and the second shunt switch.

In some embodiments, the first shunt switch comprises four series-connected FETs. The second shunt switch may comprise four series-connected FETs.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DESCRIPTION

The headings provided herein, if any, are for convenience only and do not necessarily affect the scope or meaning of the claimed invention.

Switches, including Radio Frequency (RF) and/or Single Pole Double Throw (SPDT) switches, can be important components of RF and/or other circuit applications. When a switch is turned on (i.e., in an ON state), the switch requires a positive gate-to-source voltage ($V_{GS}$) to minimize on-resistance ($R_{ON}$) of the switch. When a switch is turned off (i.e., in an OFF state), the switch requires a negative $V_{GS}$ to minimize off-capacitance ($C_{OFF}$) and/or non-linearity.

Figure 1:
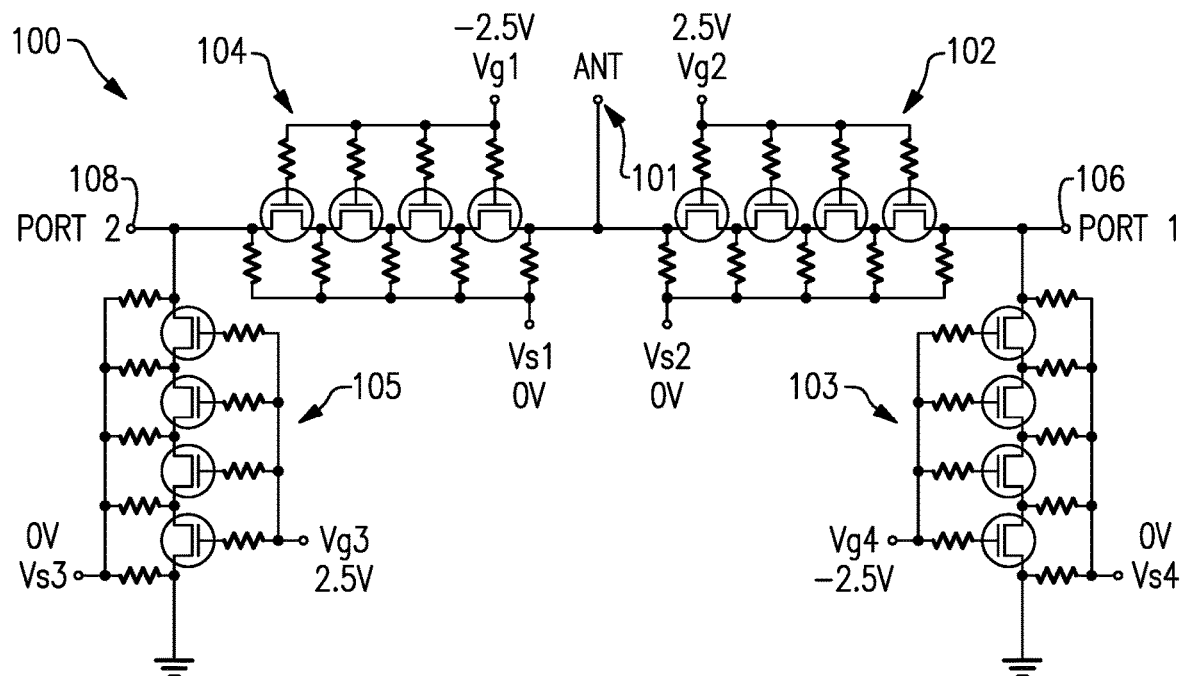
FIG. 1 illustrates an example circuit utilizing NVGs to create a negative voltage for one or more switches (e.g., Field-Effect Transistors (FETs)) of the circuit.

Various methods may be used to bias switches to an ON and/or OFF state. Some applications can utilize Negative Voltage Generators (NVGs) to provide negative voltages to switches in the OFF state. FIG. 1 illustrates an example circuit 100 utilizing NVGs to create a negative voltage for one or more switches (e.g., Field-Effect Transistors (FETs)) of the circuit 100. The circuit 100 may comprise a first series switch 102, a second series switch 104, a first shunt switch 103, and/or a second shunt switch 105. The first series switch 102 and/or first shunt switch 103 may be coupled via coupling circuitry to a first port (i.e., output) 106. The second series switch 104 and/or second shunt switch 105 may be coupled via coupling circuitry to a second port (i.e., output) 108. The circuit 100 may comprise an input 101 (e.g., a single input) coupled via coupling circuitry to the first series switch 102 and/or the second series switch 104. Coupling circuitry may be configured to couple the various components described in FIG. 1 and/or other Figures together and/or to various nodes as described herein.

Signals received at the circuit 100 via the input 101 can travel to the first port 106 or the second port 108. For the signal to travel from the input 101 to the first port 106, the first series switch 102 may be in an ON state, the second series switch 104 may be in an OFF state, the first shunt switch 103 may be in an OFF state, and/or the second shunt switch 105 may be in an ON state. Similarly, for the signal to travel from the input 101 to the second port 108, the first series switch 102 may be in an OFF state, the second series switch 104 may be in an ON state, the first shunt switch 103 may be in an ON state, and/or the second shunt switch 105 may be in an OFF state. While shunt switches may not be required for the circuit 100 to operate, shunt switches (e.g., the first shunt switch 103 and/or the second shunt switch 105) can improve impedance matching and/or isolation of the circuit 100.

Each of the switches of the circuit 100 may be capable of being biased to turn each respective switch on and/or off. To turn on a switch, a positive biasing voltage (e.g., 2.5V) exceeding a threshold voltage may be applied to the switch. Similarly, a negative $V_{GS}$ (e.g., −2.5V) may be applied to a switch to turn the switch off. Each switch may comprise a gate, a drain, and a source.

If a negative voltage is not available externally to the circuit 100, a NVG may be used to generate negative voltage at one or more switches of the circuit 100 to control a signal path of the circuit 100. Applying negative voltages can allow the circuit 100 to handle a greater voltage swing without the OFF switches turning on due to the applied voltage.

In the example shown in FIG. 1, a negative voltage (e.g., 2.5V) may be applied to the second series switch 104 and/or to the first shunt switch 103 to facilitate a signal path towards the first port 106. Alternatively, a negative voltage (e.g., 2.5V) may be applied to the first series switch 102 and/or to the second shunt switch 105 to facilitate a signal path towards the second port 108.

The circuit 100 may advantageously provide good RF and/or electrostatic discharge performance without requiring blocking capacitors. However, the circuit 100 may require NVGs, which may require a larger controller die size and/or result in relatively high stand-by current.

Figure 2:
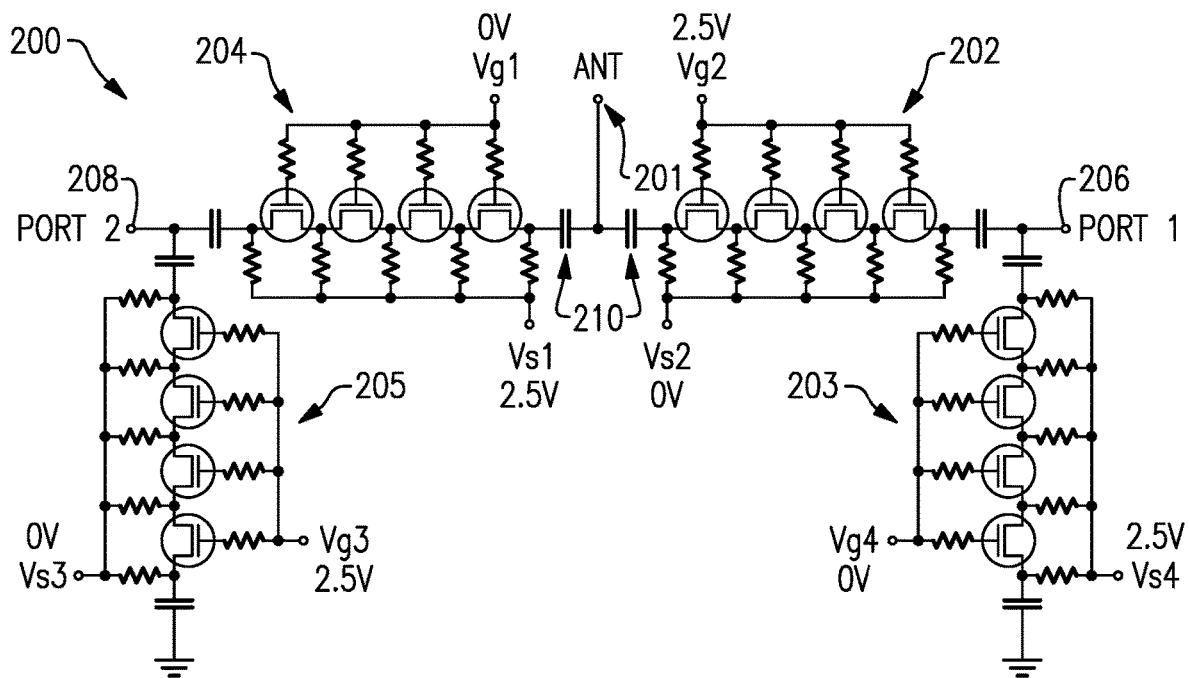
FIG. 2 illustrates another example circuit using one or more capacitors to create cross-bias at one or more switches of the circuit.

Another method of biasing circuit switches is illustrated in FIG. 2. FIG. 2 illustrates another example circuit 200 using one or more capacitors 210 to create cross-bias at one or more switches of the circuit 200. The one or more capacitors 210 may be utilized in place of NVGs and/or otherwise applying negative voltages. To cause a signal to travel to a first port 206 of the circuit 200, the gates of the second series switch 204 and/or the first shunt switch 203 may be set to 0V. The one or more capacitors 210 may be configured to block voltage to allow the gates of the switches to have different voltages than the drains and/or sources of the switches. Thus, applying 0V to the gates of the second series switch 204 and/or the first shunt switch 203 may cause the drains and sources of the second series switch 204 and/or the first shunt switch 203 to have a positive voltage (e.g., 2.5V). The voltages at the drains and/or sources of the second series switch 204 and/or the first shunt switch 203 may be equivalent to positive voltages applied to the gates of a first series switch 202 and/or a second shunt switch 205. The first series switch 202 and/or the second series switch 204 may be coupled to an antenna/input port 201. The second series switch 204, when in an ON state, may be configured to draw signals toward a second port 208.

The circuit 200 may advantageously not require NVGs, which may allow for a relatively low controller die size and/or may result in relatively low stand-by current. However, the circuit 200 may require additional electrostatic discharge protection and/or may result in degraded RF performance.

Described herein are switch topologies that do not require NVGs and/or cross-bias capacitors. Some embodiments described herein may be configured to achieve similar RF and/or electrostatic discharge performance to circuits utilizing NVGs and/or cross-bias capacitors. Some embodiments may involve use of one or more short-out switches (e.g., FETs) to effectively create back-to-back diode configuration performance to maintain an OFF state at switches set to an OFF state. Such a configuration can provide relatively low voltage clipping and/or relatively low compression.

Some embodiments may be utilized in Silicon-on-Insulator (SOI) processes. In some cases, embodiments described herein can provide a significant impact on various processes. For example, Complementary Metal-Oxide-Semiconductor (CMOS) and/or Bipolar CMOS processes may be incompatible with negative voltages due to grounded substrates.

Figure 3:
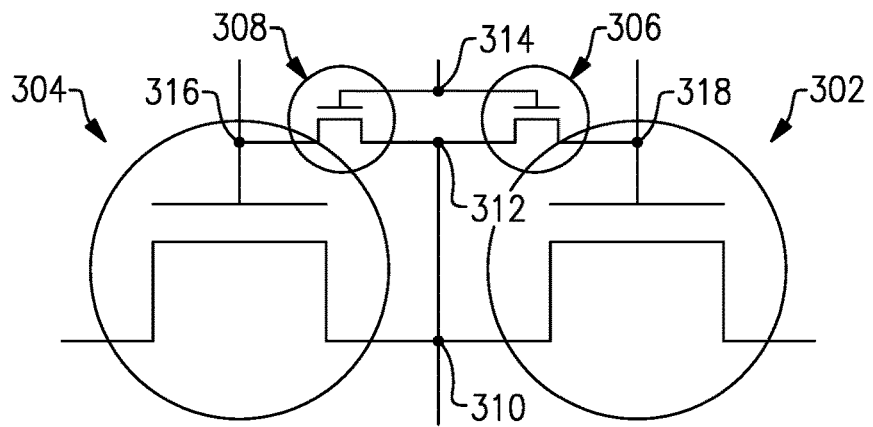
FIG. 3 illustrates a network of multiple switches which may be utilized in circuits described herein.

FIG. 3 illustrates a network of multiple switches which may be utilized in circuits described herein. The network of switches includes a first switch 302, a second switch 304, a third switch 306, and/or a fourth switch 308. A gate of the first switch 302 may be coupled (via coupling circuitry) to a drain or source of the third switch 306 and the gate of the second switch 304 may be coupled to a drain or source of the fourth switch 308. Moreover, a gate of the third switch 306 may be coupled to a gate of the fourth switch 308 and/or a drain or source of the third switch 306 may be coupled to a drain or source of the fourth switch 308. For example, a drain of the first switch 302 and a source of the second switch 304 may be coupled to a first node 310, a drain of the third switch 306 and a source of the fourth switch 308 may be coupled to a second node 312, a gate of the third switch 306 and a gate of the fourth switch 308 may be coupled to a third node 314, a drain of the fourth switch 308 and the gate of the second switch 304 may be coupled to a fourth node 316, and/or a source of the third switch 306 and the gate of the first switch 302 may be coupled to a fifth node 318. The first node 310 and the second node 312 may be coupled together.

Figure 4:
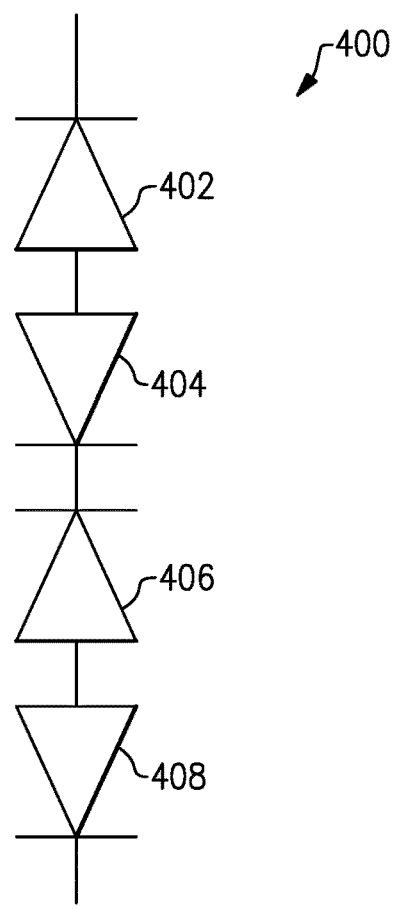
FIG. 4 illustrates an example back-to-back diode in accordance with one or more embodiments.

This coupling of the first switch 302, second switch 304, third switch 306, and/or fourth switch 308 may operate similarly to a back-to-back diode. FIG. 4 illustrates an example back-to-back diode 400. While some circuits described herein may not comprise diodes and/or back-to-back diodes, a topology of switches in some circuits described herein may be configured to operate as a back-to-back diode 400. An example back-to-back diode 400 may comprise a first diode 402 coupled back-to-back with a second diode 404 and/or may comprise a third diode 406 coupled back-to-back with a fourth diode 408. The back-to-back diode 400 may operate in a complementary manner in which the first diode 402 being in an ON state may ensure that the second diode 404 is in an OFF state. The back-to-back diode 400 can thus effectively block signals during an OFF state without requiring a negative voltage. The third switch 306 and the fourth switch 308 of the network in FIG. 3 can similarly effectively block signals in an OFF state.

Figure 5:
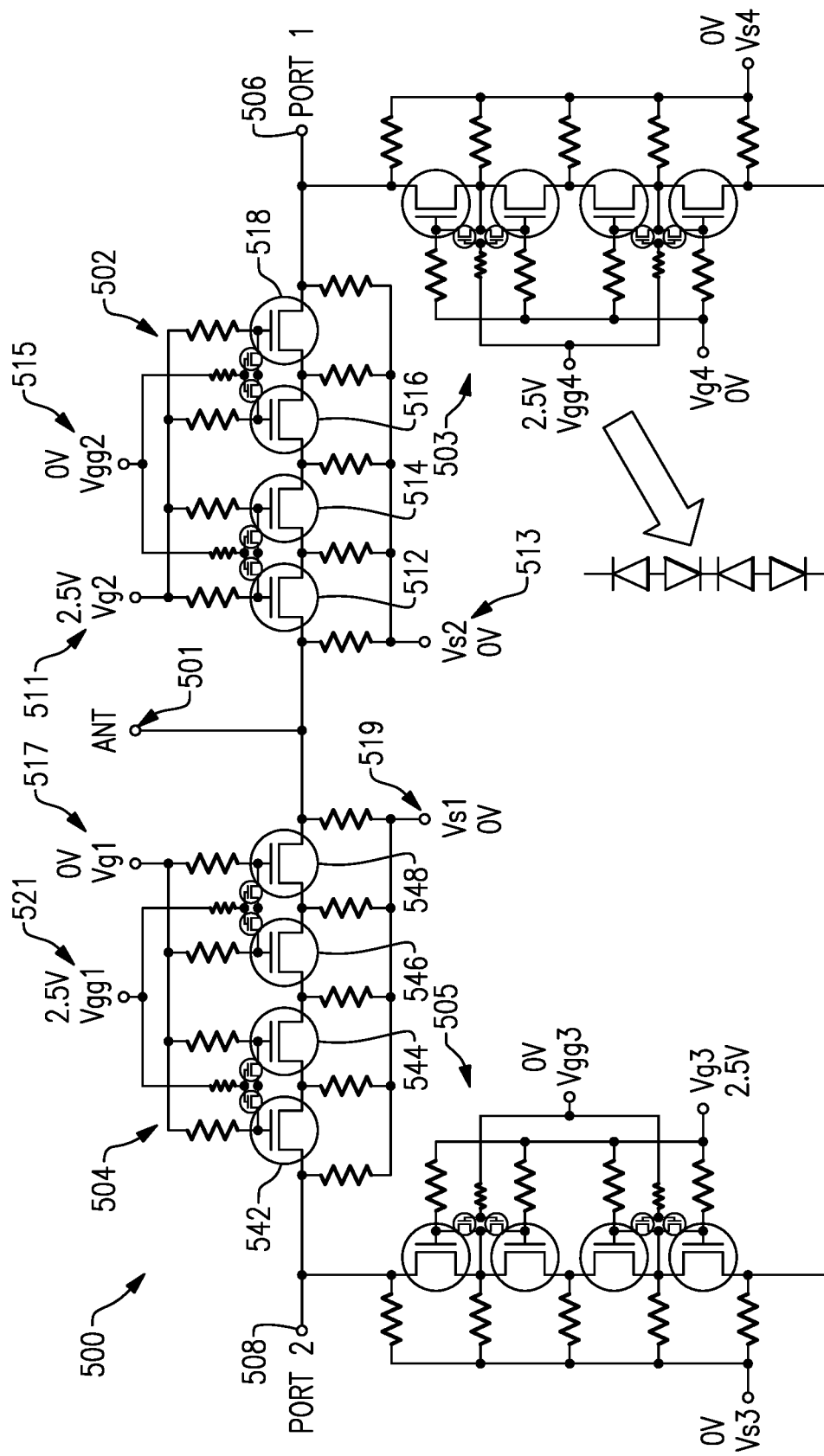
FIG. 5 illustrates an example circuit having one or more features as described herein.

FIG. 5 illustrates an example circuit 500. The circuit 500 may comprise a first series switch 502, a second series switch 504, a first shunt switch 503, and/or a second shunt switch 505. The first series switch 502 and/or first shunt switch 503 may be coupled via coupling circuitry to a first port (i.e., output) 506. The second series switch 504 and/or second shunt switch 505 may be coupled via coupling circuitry to a second port (i.e., output) 508. The circuit 500 may comprise an input 501 (e.g., a single input) coupled via coupling circuitry to the first series switch 502 and/or the second series switch 504.

One or more of the switches may comprise multiple switches. For example, the first series switch 502 may comprise four switches, with gates of each of the four switches being coupled to a first gate voltage 511. Sources and/or drains of the four switches may similarly be coupled to a common source voltage 513. The first series switch 502 may comprise a first switch 512, a second switch 514, a third switch 516, and/or a fourth switch 518. Gates of the first switch 512, second switch 514, third switch 516, and/or fourth switch 518 may be coupled to the first gate voltage 511. The second series switch 504, first shunt switch 503, and/or second shunt switch 505 may similarly comprise multiple switches.

In some embodiments, a gate of the first switch 512 may be coupled to a fifth switch (see FIG. 3 for closer views of the additional switches including the fifth switch, which corresponds to the fourth switch 308 of FIG. 3). A gate of the second switch 514 may be coupled to a sixth switch. A source or drain of the fifth switch and a source or drain of the sixth switch may be coupled to a first node. A gate of the fifth switch and a gate of the sixth switch may be coupled to a second node. The first node may be coupled to a second gate voltage 515.

Moreover, a gate of the third switch 516 may be coupled to a seventh switch. A gate of the fourth switch 518 may be coupled to an eighth switch. A source or drain of the seventh switch and a source or drain of the eighth switch may be coupled to a third node. A gate of the seventh switch and a gate of the eighth switch may be coupled to a fourth node. The third node may be coupled to the second gate voltage 515.

The fifth switch and the sixth switch (and seventh switch and eighth switch) may be configured to block voltage and/or signals, similarly to a back-to-back diode. In this way, the various switches comprising the first series switch 502 may be configured to receive a positive (e.g., 2.5V) second gate voltage 515 while maintaining a 0V source voltage 513.

The second series switch 504 may be coupled via coupling circuitry to a second port (i.e., output) 508. In some embodiments, the second series switch 504 may comprise four switches, with gates of each of the four switches being coupled to a first gate voltage 517. Sources and/or drains of the four switches may similarly be coupled to a common source voltage 519. The second series switch 504 may comprise a first switch 542, a second switch 544, a third switch 546, and/or a fourth switch 548. Gates of the first switch 542, second switch 544, third switch 546, and/or fourth switch 548 may be coupled to the first gate voltage 517.

In some embodiments, a gate of the first switch 542 may be coupled to a fifth switch. A gate of the second switch 544 may be coupled to a sixth switch. A source or drain of the fifth switch and a source or drain of the sixth switch may be coupled to a first node. A gate of the fifth switch and a gate of the sixth switch may be coupled to a second node. The first node may be coupled to a second gate voltage 521.

Moreover, a gate of the third switch may be coupled to a seventh switch. A gate of the fourth switch may be coupled to an eighth switch. A source or drain of the seventh switch and a source or drain of the eighth switch may be coupled to a third node. A gate of the seventh switch and a gate of the eighth switch may be coupled to a fourth node. The third node may be coupled to the second gate voltage 521.

The fifth switch and the sixth switch (and seventh switch and eighth switch) may be configured to block voltage and/or signals, similarly to a back-to-back diode. In this way, the various switches comprising the first series switch 502 may be configured to receive a positive (e.g., 2.5V) second gate voltage 521 while maintaining a 0V source voltage 519.

In some embodiments, the first series switch 502 may be configured to be in an ON state when the second series switch 504 is in an OFF state. Similarly, the second series switch 504 may be configured to be in an ON state when the first series switch 502 is in an OFF state. For example, the first gate voltage 511 at the first series switch 502 and/or the second gate voltage 521 at the second series switch 504 may be positive (e.g., 2.5V) while the second gate voltage 515 at the first series switch 502 and/or the first gate voltage 517 at the second series switch 504 may be approximately 0V. Similarly, the first gate voltage 511 at the first series switch 502 and/or the second gate voltage 521 at the second series switch 504 may be approximately 0V while the second gate voltage 515 at the first series switch 502 and/or the first gate voltage 517 at the second series switch 504 may be positive (e.g., 2.5V). The first source voltages 513, 519 at the first series switch 502 and/or second series switch 504 may be approximately 0V at both the ON state and the OFF state.

The first shunt switch 503 may comprise a similar network of switches and/or voltage sources to that of the first series switch 502. Moreover, the second shunt switch 505 may comprise a similar network of switches and/or voltage sources to that of the second series switch 502. Accordingly, the first shunt switch 503 may be configured to be in an ON state when the first series switch 502 is in an ON state and/or the first shunt switch 503 may be configured to be in an OFF state when the first series switch 502 is in an OFF state. Similarly, the second shunt switch 505 may be configured to be in an ON state when the second series switch 504 is in an ON state and/or the second shunt switch 505 may be configured to be in an OFF state when the second series switch 504 is in an OFF state.

Figure 6:
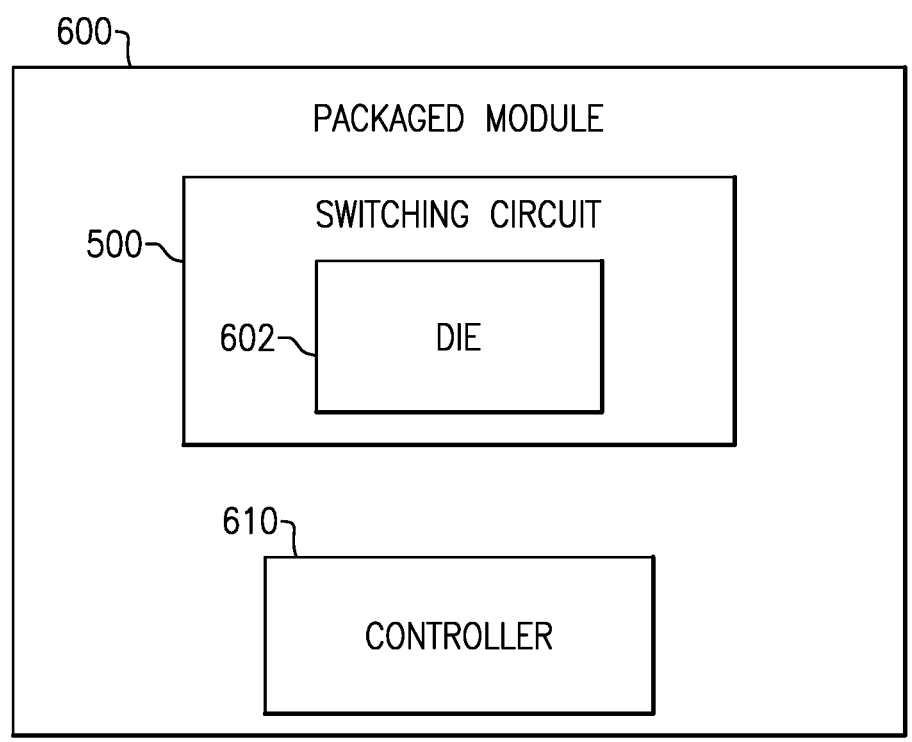
FIG. 6 illustrates an example packaged module having one or more features as described herein.

In the example of FIG. 6, the switching circuit 500 of FIG. 5 can be included in a packaged module 600. The switching circuit 500 can comprise a semiconductor die 602, which can include the various switches and/or coupling circuitry described herein with respect to FIG. 5 and/or other figures.

The packaged module 600 can further include a controller 610. Such a controller can be configured to provide, for example, the logic functionality as described herein to selectively bias the various switches of the switching circuit 500. In some embodiments, such a controller can be configured to operate with a control standard such as mobile industry processor interface (MIPI) standard.

In some implementations, an architecture, device and/or circuit having one or more features described herein can be included in an RF device such as a wireless device. Such an architecture, device and/or circuit can be implemented directly in the wireless device, in one or more modular forms as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, etc. Although described in the context of wireless devices, it will be understood that one or more features of the present disclosure can also be implemented in other RF systems such as base stations.

Figure 7:
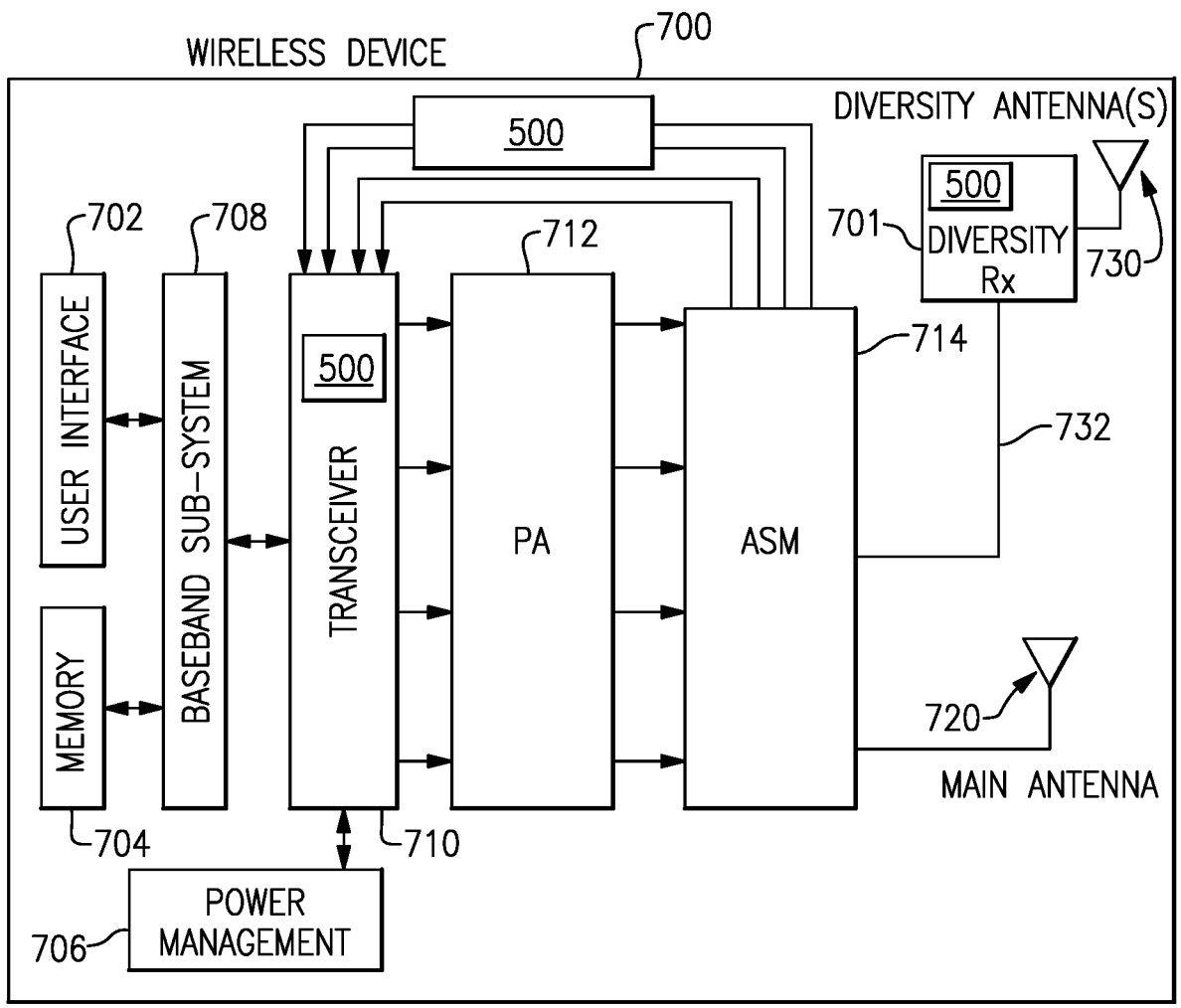
FIG. 7 depicts an example wireless device having one or more advantageous features described herein.

FIG. 7 depicts an example wireless device 700 having one or more advantageous features described herein. As described herein, one or more switching circuits having one or more features as described herein can be implemented in a number of places in such a wireless device. For example, in some embodiments, a switching circuit 500 having one or more features as described herein can be implemented in a module such as a diversity receive (DRx) module 701 having one or more low-noise amplifiers (LNAs).

In some embodiments, a switching circuit 500 having one or more features as described herein can be implemented in a transceiver. Such a switching circuit can be implemented as a separate module within the transceiver, or as a part of a transceiver module.

In some embodiments, a switching circuit 500 having one or more features as described herein can be implemented between a front-end module (e.g., DRx module) and a transceiver. Such a switching circuit 500 can be implemented as a separate module, as an assembly of circuit elements, or any combination thereof.

In the example of FIG. 7, power amplifiers (PAs) in a PA module 712 can receive their respective RF signals from a transceiver 710 that can be configured and operated to generate RF signals to be amplified and transmitted, and to process received signals. The transceiver 710 is shown to interact with a baseband sub-system 708 that is configured to provide conversion between data and/or voice signals suitable for a user and RF signals suitable for the transceiver 710. The transceiver 710 is also shown to be connected to a power management component 706 that is configured to manage power for the operation of the wireless device 700. Such power management can also control operations of the baseband sub-system 708 and other components of the wireless device 700.

The baseband sub-system 708 is shown to be connected to a user interface 702 to facilitate various input and output of voice and/or data provided to and received from the user. The baseband sub-system 708 can also be connected to a memory 704 that is configured to store data and/or instructions to facilitate the operation of the wireless device, and/or to provide storage of information for the user.

In the example of FIG. 7, the DRx module 701 can be implemented between one or more diversity antennas (e.g., diversity antenna 730) and the ASM 714. Such a configuration can allow an RF signal received through the diversity antenna 730 to be processed (in some embodiments, including amplification by an LNA) with little or no loss of and/or little or no addition of noise to the RF signal from the diversity antenna 730. Such processed signal from the DRx module 70100 can then be routed to the ASM through one or more signal paths.

In the example of FIG. 7, a main antenna 720 can be configured to, for example, facilitate transmission of RF signals from the PA module 712. In some embodiments, receive operations can also be achieved through the main antenna.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

One or more features of the present disclosure can be implemented with various cellular frequency bands as described herein. Examples of such bands are listed in Table 1. It will be understood that at least some of the bands can be divided into sub-bands. It will also be understood that one or more features of the present disclosure can be implemented with frequency ranges that do not have designations such as the examples of Table 1.

TABLE 1

| Band | Mode | Tx Frequency Range (MHz) | Rx Frequency Range (MHz) |
|---|---|---|---|
| B1 | FDD | 1,920–1,980 | 2,110–2,170 |
| B2 | FDD | 1,850–1,910 | 1,930–1,990 |
| B3 | FDD | 1,710–1,785 | 1,805–1,880 |
| B4 | FDD | 1,710–1,755 | 2,110–2,155 |
| B5 | FDD | 824–849 | 869–894 |
| B6 | FDD | 830–840 | 875–885 |
| B7 | FDD | 2,500–2,570 | 2,620–2,690 |
| B8 | FDD | 880–915 | 925–960 |
| B9 | FDD | 1,749.9–1,784.9 | 1,844.9–1,879.9 |
| B10 | FDD | 1,710–1,770 | 2,110–2,170 |
| B11 | FDD | 1,427.9–1,447.9 | 1,475.9–1,495.9 |
| B12 | FDD | 699–716 | 729–746 |
| B13 | FDD | 777–787 | 746–756 |
| B14 | FDD | 788–798 | 758–768 |
| B15 | FDD | 1,900–1,920 | 2,600–2,620 |
| B16 | FDD | 2,010–2,025 | 2,585–2,600 |
| B17 | FDD | 704–716 | 734–746 |
| B18 | FDD | 815–830 | 860–875 |
| B19 | FDD | 830–845 | 875–890 |

TABLE 1-continued

| Band | Mode | Tx Frequency Range (MHz) | Rx Frequency Range (MHz) |
|---|---|---|---|
| B20 | FDD | 832-862 | 791-821 |
| B21 | FDD | 1,447.9-1,462.9 | 1,495.9-1,510.9 |
| B22 | FDD | 3,410-3,490 | 3,510-3,590 |
| B23 | FDD | 2,000-2,020 | 2,180-2,200 |
| B24 | FDD | 1,626.5-1,660.5 | 1,525-1,559 |
| B25 | FDD | 1,850-1,915 | 1,930-1,995 |
| B26 | FDD | 814-849 | 859-894 |
| B27 | FDD | 807-824 | 852-869 |
| B28 | FDD | 703-748 | 758-803 |
| B29 | FDD | N/A | 716-728 |
| B30 | FDD | 2,305-2,315 | 2,350-2,360 |
| B31 | FDD | 452.5-457.5 | 462.5-467.5 |
| B33 | TDD | 1,900-1,920 | 1,900-1,920 |
| B34 | TDD | 2,010-2,025 | 2,010-2,025 |
| B35 | TDD | 1,850-1,910 | 1,850-1,910 |
| B36 | TDD | 1,930-1,990 | 1,930-1,990 |
| B37 | TDD | 1,910-1,930 | 1,910-1,930 |
| B38 | TDD | 2,570-2,620 | 2,570-2,620 |
| B39 | TDD | 1,880-1,920 | 1,880-1,920 |
| B40 | TDD | 2,300-2,400 | 2,300-2,400 |
| B41 | TDD | 2,496-2,690 | 2,496-2,690 |
| B42 | TDD | 3,400-3,600 | 3,400-3,600 |
| B43 | TDD | 3,600-3,800 | 3,600-3,800 |
| B44 | TDD | 703-803 | 703-803 |

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers. Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A switching circuit comprising:
a first series switch coupled to a first output port, the first series switch including a first field-effect transistor (FET), a second FET, a third FET, a fourth FET, a fifth FET, and a sixth FET; and
a second series switch coupled to a second output port;
a gate of the fifth FET being directly coupled to a gate of the sixth FET at a first node, a source of the fifth FET being coupled to a drain of the sixth FET at a second node, a source of the first FET being coupled to a drain of the second FET at a third node, a gate of the first FET being coupled to a drain of the fifth FET at a fourth node, a gate of the second FET being coupled to a source of the sixth FET at a fifth node, the fourth node and the fifth node being coupled to a first gate voltage, and the first node being coupled to a second gate voltage that is different than the first gate voltage.

2. The switching circuit of claim 1 further comprising a first shunt switch, wherein the first output port is coupled between the first series switch and the first shunt switch.

3. The switching circuit of claim 2 further comprising a second shunt switch, wherein the second output port is coupled between the second series switch and the second shunt switch.

4. The switching circuit of claim 3 wherein the first shunt switch comprises four series-connected FETs.

5. The switching circuit of claim 3 wherein the second shunt switch comprises four series-connected FETs.

6. The switching circuit of claim 1 wherein the second series switch comprises four series-connected FETs.

7. The switching circuit of claim 1 wherein the first series switch further comprises a seventh FET and an eighth FET.

8. The switching circuit of claim 1 wherein the first gate voltage is configured to be approximately 0 V while the second gate voltage is positive.

9. The switching circuit of claim 1 wherein the second gate voltage is configured to be approximately 0 V while the first gate voltage is positive.

10. A wireless device comprising:
a first series switch coupled to a first output port, the first series switch including a first field-effect transistor (FET), a second FET, a third FET, a fourth FET, a fifth FET, and a sixth FET; and
a second series switch coupled to a second output port;
the fifth FET being coupled to the first FET, a gate of the fifth FET being directly coupled to a gate of the sixth FET, the first FET being coupled to the second FET, the first FET and the second FET being coupled to a first gate voltage, and the fifth FET and the sixth FET being coupled to a second gate voltage that is different than the first gate voltage.

11. The wireless device of claim 10 further comprising a first shunt switch, wherein the first output port is coupled between the first series switch and the first shunt switch.

12. The wireless device of claim 11 further comprising a second shunt switch, wherein the second output port is coupled between the second series switch and the second shunt switch.

13. The wireless device of claim 12 wherein the first shunt switch comprises four series-connected FETs.

14. The wireless device of claim 12 wherein the second shunt switch comprises four series-connected FETs.

15. The wireless device of claim 10 wherein the second series switch comprises four series-connected FETs.

16. A semiconductor die comprising:
a first series switch coupled to a first output port, the first series switch including a first field-effect transistor (FET), a second FET, a third FET, a fourth FET, a fifth FET, and a sixth FET; and
a second series switch coupled to a second output port;
the fifth FET being coupled to the first FET, a gate of the fifth FET being coupled to a gate of the sixth FET, the first FET being coupled to the second FET, the first FET and the second FET being coupled to a first gate voltage, and the fifth FET and the sixth FET being coupled to a second gate voltage that is different than the first gate voltage.

17. The semiconductor die of claim 16 further comprising a first shunt switch, wherein the first output port is coupled between the first series switch and the first shunt switch.

18. The semiconductor die of claim 17 further comprising a second shunt switch, wherein the second output port is coupled between the second series switch and the second shunt switch.

19. The semiconductor die of claim 18 wherein the first shunt switch comprises four series-connected FETs.

20. The semiconductor die of claim 18 wherein the second shunt switch comprises four series-connected FETs.

* * * * *